US012763025B1

(12) United States Patent
Hu et al.

(10) Patent No.: US 12,763,025 B1
(45) Date of Patent: Oct. 13, 2026

(54) DISPLAY PANEL AND DISPLAY DEVICE

(71) Applicant: Tianma Advanced Display Technology Institute (Xiamen) Co., Ltd., Xiamen (CN)

(72) Inventors: Yuqi Hu, Xiamen (CN); Jiajie Li, Xiamen (CN)

(73) Assignee: Tianma Advanced Display Technology Institute (Xiamen) Co., Ltd., Xiamen (CN)

( * ) Notice: Subject to any disclaimer, the term of this patent is extended or adjusted under 35 U.S.C. 154(b) by 0 days.

(21) Appl. No.: 19/325,746

(22) Filed: Sep. 11, 2025

(30) Foreign Application Priority Data

Jun. 30, 2025 (CN) ........................ 202510896386.7

(51) Int. Cl.
*H10H 29/49* (2025.01)
*G09G 3/3233* (2016.01)
*H10H 29/32* (2025.01)
*H10K 59/131* (2023.01)

(52) U.S. Cl.
CPC ........... *G09G 3/3233* (2013.01); *H10H 29/32* (2025.01); *H10H 29/49* (2025.01); *G09G 2300/0426* (2013.01); *G09G 2300/0842* (2013.01); *G09G 2300/0861* (2013.01); *G09G 2310/08* (2013.01); *G09G 2320/0242* (2013.01); *H10K 59/1315* (2023.02)

(58) Field of Classification Search
CPC ......... G09G 3/3233; G09G 2300/0426; G09G 2300/0842; G09G 2300/0861; G09G 2310/08; G09G 2320/0242; H10H 29/32; H10H 29/49; H10K 59/1315
See application file for complete search history.

(56) References Cited

U.S. PATENT DOCUMENTS

2024/0381717 A1* 11/2024 Xiao .................... H10K 59/131
2026/0120628 A1* 4/2026 Kim ......................... G09G 3/32

* cited by examiner

*Primary Examiner* — Douglas Wilson
(74) *Attorney, Agent, or Firm* — Anova Law Group, PLLC

(57) ABSTRACT

The present disclosure provides a display panel and a display device, which include a light-emitting element and a pixel circuit connected to the light-emitting element. The pixel circuit includes a driving transistor and a first light-emitting control transistor, where the first electrode of the driving transistor is coupled to the first power supply terminal, and the second electrode of the driving transistor is connected to the first electrode of the first light-emitting control transistor through a first connection part. The second electrode of the first light-emitting control transistor is coupled to the first electrode of the light-emitting element, and the second electrode of the light-emitting element is coupled to the second power supply terminal. The resistance of the first connection parts corresponding to at least two different pixel circuits is different.

20 Claims, 9 Drawing Sheets

DISPLAY PANEL AND DISPLAY DEVICE

CROSS-REFERENCE TO RELATED DISCLOSURE

The present application claims priority of Chinese Patent Disclosure No. 202510896386.7, filed on Jun. 30, 2025, the entire content of which is hereby incorporated by reference.

FIELD OF THE DISCLOSURE

The present application relates to the field of display technology, and in particular to a display panel and a display device.

BACKGROUND

With the continuous development of science and technology, more and more display products, such as mobile phones, tablets, laptops and smart wearable devices, are widely used in people's daily life and work, bringing great convenience to people's daily life and work, and becoming an indispensable tool for people today.

In existing display products, due to the difference in characteristics of light-emitting elements of different luminous colors, the current uniformity of light-emitting elements of different luminous colors is different, which manifests as a color cast problem in the display screen. Therefore, how to improve the color uniformity of display products and enhance the display performance has become one of the technical problems that need to be urgently solved at this stage.

SUMMARY

In order to solve the above technical problems, the present disclosure provides a display panel and a display device.

In one aspect, the present disclosure provides a display panel, including a light-emitting element and a pixel circuit connected to the light-emitting element. The pixel circuit includes a driving transistor and a first light-emitting control transistor, where a first electrode of the driving transistor is coupled to a first power supply terminal, and a second electrode of the driving transistor is connected to a first electrode of the first light-emitting control transistor through a first connection part. A second electrode of the first light-emitting control transistor is coupled to a first electrode of the light-emitting element, and a second electrode of the light-emitting element is coupled to a second power supply terminal. The resistance of the first connection parts corresponding to at least two different pixel circuits is different.

In another aspect, the present disclosure further provides a display device, including a display panel as described elsewhere.

Other aspects of the present disclosure may be understood by those skilled in the art in light of the description, the claims, and the drawings of the present disclosure.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure.

In order to more clearly illustrate the embodiments of the present disclosure or the technical solutions in the existing technologies, the drawings essential for understanding the embodiments or the description of the existing technologies will be briefly introduced below. Apparently, for a person skilled in the art, other drawings may be obtained based on these drawings without making creative efforts.

DETAILED DESCRIPTION

In order to more clearly understand the above-mentioned objectives, features and advantages of the present disclosure, the scheme of the present disclosure will be further described below. It should be noted that the embodiments of the present disclosure and the features in the embodiments may be combined with each other without conflict.

In the following description, many specific details are set forth to facilitate an understanding of the present disclosure, but the present disclosure may also be implemented in other ways different from those described herein. It is obvious that the embodiments in the specification are merely part of the embodiments of the present disclosure, rather than all of the embodiments.

Figure 1:
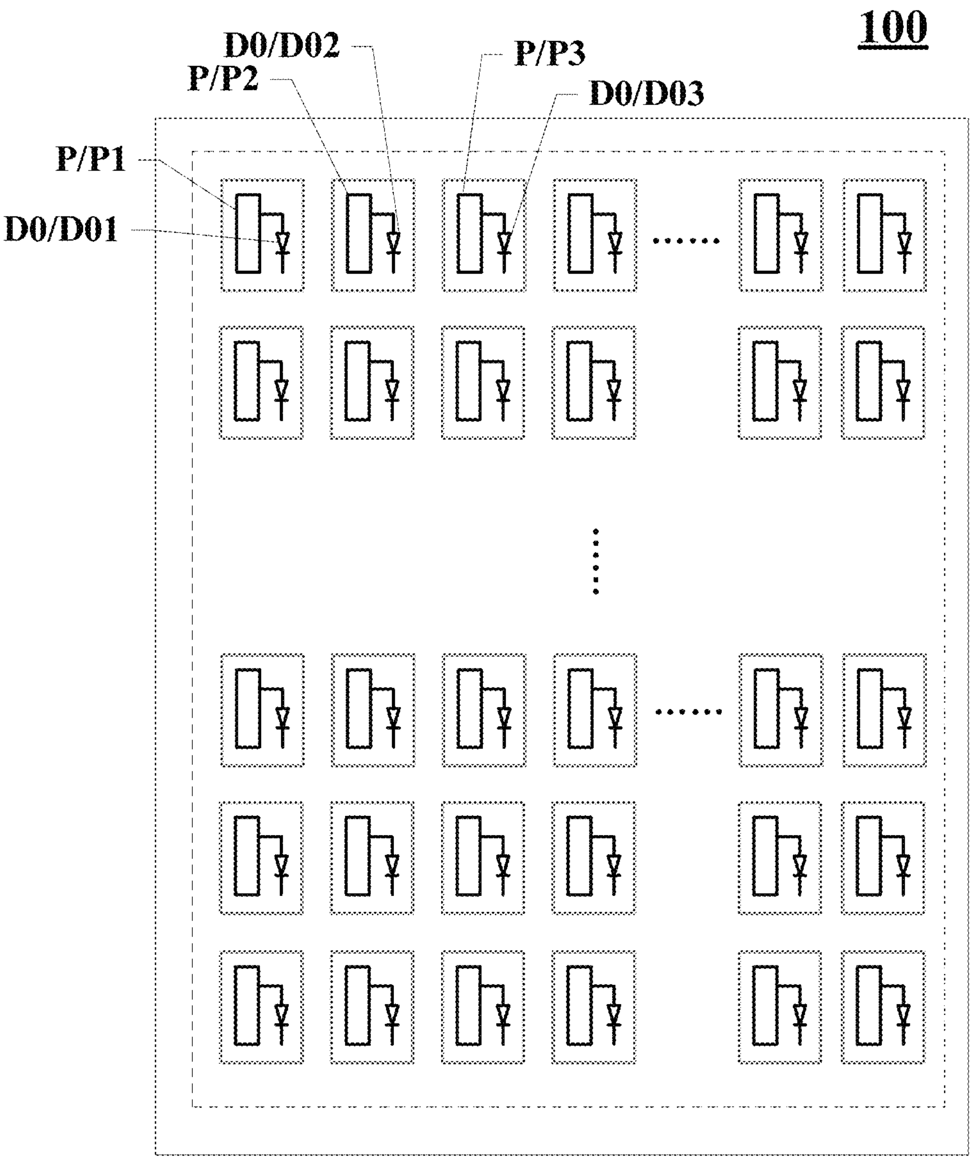
FIG. 1 is a schematic plan view of a display panel in accordance with an embodiment of the present disclosure.
Figure 2:
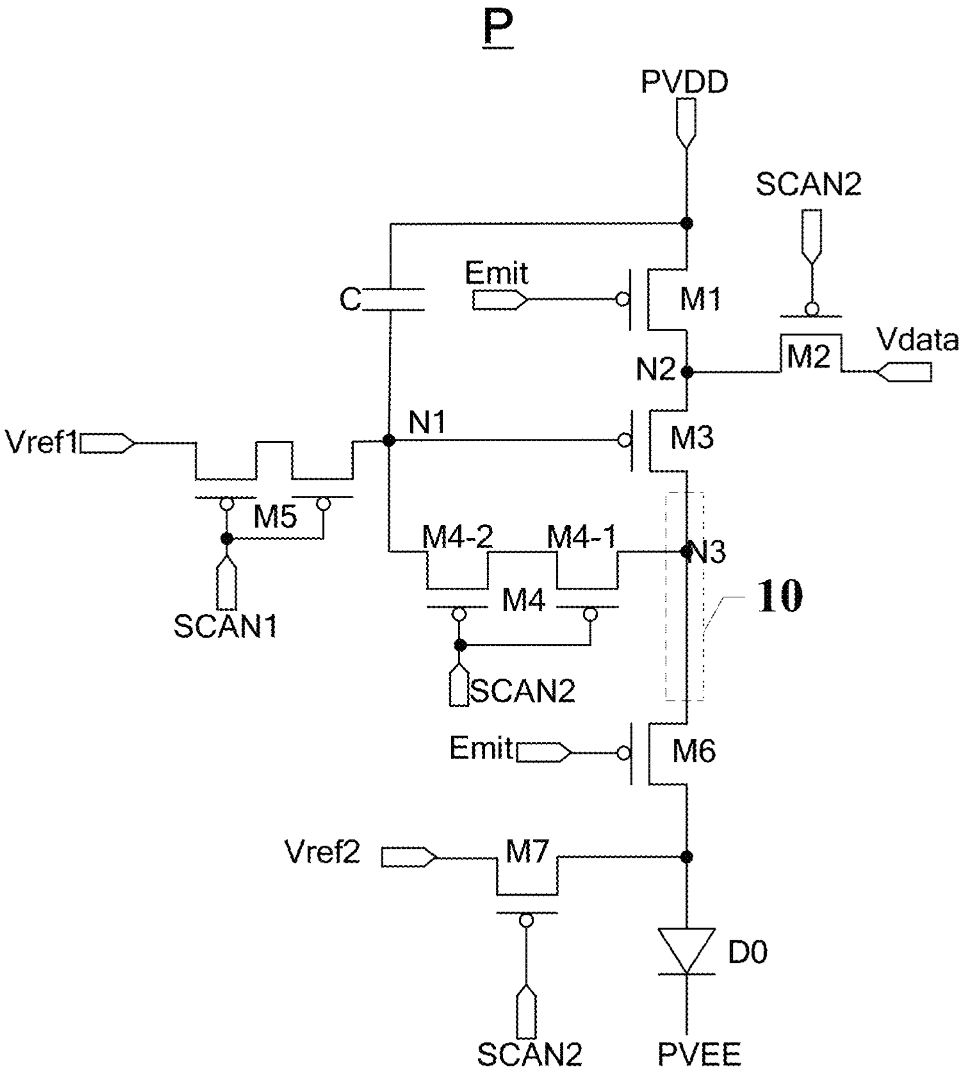
FIG. 2 is a circuit diagram of a pixel circuit in accordance with an embodiment of the present disclosure.
Figure 3:
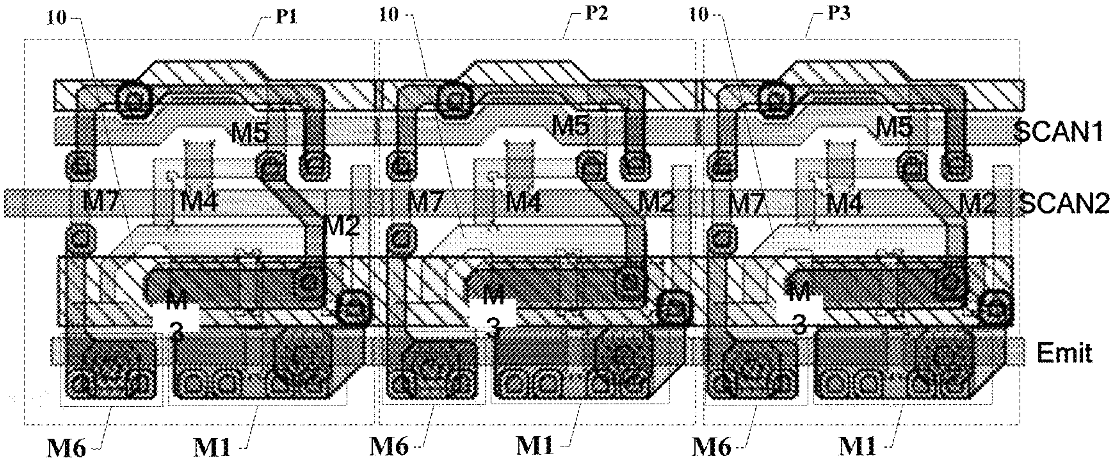
FIG. 3 is a schematic diagram showing a layout of a pixel circuit in accordance with an embodiment of the present disclosure.

FIG. 1 is a planar schematic diagram of a display panel in accordance with an embodiment of the present disclosure, FIG. 2 is a circuit schematic diagram of a pixel circuit in accordance with an embodiment of the present disclosure, and FIG. 3 is a schematic diagram showing a layout of a pixel circuit in accordance with an embodiment of the present disclosure. It should be noted that FIG. 1 merely takes a display panel with a rectangular structure as an example, and does not limit the actual shape of the display panel. In some embodiments, the display panel may also be embodied in any other feasible shape, such as a circle or a rounded rectangle. Optionally, the display panel provided in the present disclosure may be a Micro LED display panel or a Mini LED display panel, in which case the corresponding light-emitting elements are Micro LEDs or Mini LEDs. In some embodiments, the display panel may also be embodied as an organic light-emitting display panel, and the corresponding light-emitting elements are organic electroluminescent elements, which is not limited in the present disclosure.

Referring now to FIGS. 1 and 2, the present disclosure provides a display panel 100, including a light-emitting element D0 and a pixel circuit P connected to the light-emitting element D0. The pixel circuit P includes a driving transistor M3 and a first light-emitting control transistor M6, where a first electrode of the driving transistor M3 is coupled to a first power supply terminal PVDD, and a second electrode of the driving transistor M3 is connected to a first electrode of the first light-emitting control transistor M6 through a first connection part 10. A second electrode of the first light-emitting control transistor M6 is coupled to a first electrode of the light-emitting element D0, and a second electrode of the light-emitting element D0 is coupled to a second power supply terminal PVEE. The resistance of the first connection parts 10 corresponding to at least two different pixel circuits P is different.

It should be noted that the specific circuit structure of the pixel circuit mentioned in the embodiments of the present disclosure may refer to FIG. 2. Taking FIG. 2 as an example, illustratively, the pixel circuit P includes transistors M1-M7 and a capacitor C, where the gate, the first electrode and the second electrode of the driving transistor M3 are respectively connected to the first node N1, the second node N2 and the third node N3. The first electrode and the second electrode of the transistor M5 are respectively connected to the gate reset signal terminal Vref1 and the first node N1, the gate is connected to the first scan signal SCAN1, and is configured to receive the reset control signal, and the transistor M5 is configured to provide the gate reset signal Vref1 to the first node N1. The first electrode and the second electrode of the transistor M2 are respectively connected to the data voltage signal terminal Vdata and the second node N2, the gate receives the second scan signal SCAN2, and the transistor M2 is configured to transmit the data voltage signal Vdata to the second node N2. It should be noted that a signal terminal and a signal transmitted by the signal terminal in the embodiments of the present disclosure are represented by a same reference numeral. The first electrode and the second electrode of the transistor M4 are respectively connected to the third node N3 and the first node N1, the gate is connected to the second scan signal SCAN2, and the transistor M4 is configured to perform threshold compensation on the driving transistor M3. The first electrode and the second electrode of the transistor M7 are respectively connected to the anode reset signal terminal Vref2 and the first electrode of the light-emitting element D0, and the gate is connected to the second scan signal terminal SCAN2. The transistor M7 is configured to reset the first electrode (for example, the anode) of the light-emitting element D0. The first electrode and the second electrode of the transistor M1 are respectively connected to the first power supply terminal PVDD and the second node N2, and the gate is connected to the light-emitting control signal terminal Emit. The first electrode and the second electrode of the first light-emitting control transistor M6 are respectively connected to the third node N3 and the first electrode of the light-emitting element D0, and the gate is connected to the light-emitting control signal terminal Emit, and is configured to transmit the driving current to the light-emitting element D0. The second electrode of the light-emitting element D0 is connected to the second power supply terminal PVEE.

It should be noted that the pixel circuit in FIG. 2 is merely for illustration, and the present disclosure does not limit the specific structure of the pixel circuit. In the embodiment of FIG. 2, transistors M1 to M7 are all P-type transistors, and the transistor M4 and the transistor M5 connected to the first node N1 each include two sub-transistors, so as to reduce the leakage of the transistor M4 and the transistor M5 to the first node N1, thereby facilitating the stability of the potential of the gate of the driving transistor M3 connected to the first node N1. In some embodiments, the transistor M4 and the transistor M5 may also be embodied as N-type transistors, and an N-type transistor may be an oxide transistor. In this way, it is also beneficial to reduce the leakage of the fourth transistor M4 and the fifth transistor M5 to the first node N1, thereby facilitating the stability of the potential of the gate of the driving transistor M3 connected to the first node N1.

Figure 4:
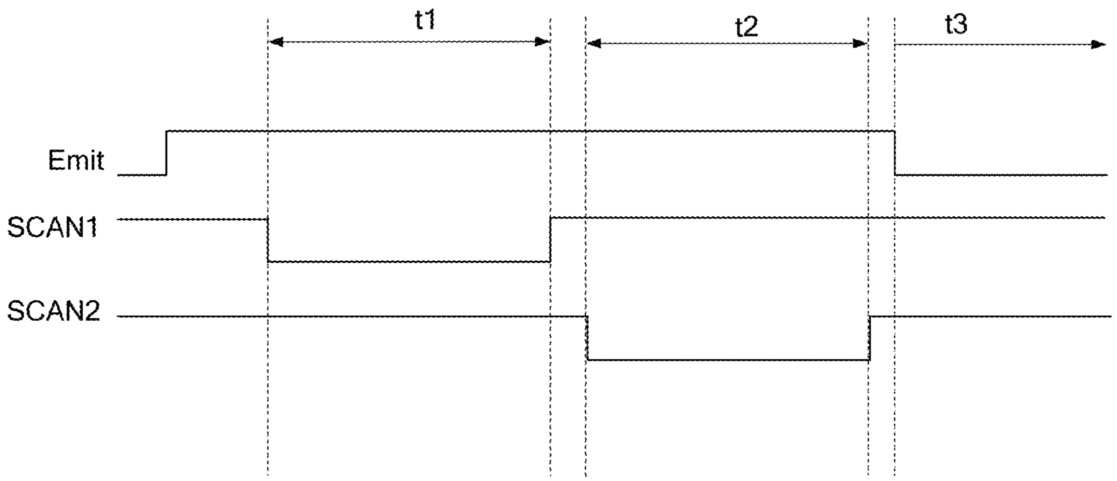
FIG. 4 is a timing diagram of the pixel circuit in FIG. 2.

The working principle of FIG. 2 will be described below in conjunction with FIG. 4. FIG. 4 is a timing diagram of the pixel circuit in FIG. 2. The pixel circuit includes an initialization phase t1, a data writing and threshold compensation phase t2, and a light-emitting phase t3.

In the initialization phase t1, the low potential signal of the first control signal SCAN1 controls the transistor M5 to be turned on, and transmits the gate reset signal Vref1 to the gate of the driving transistor M3 for initialization, thereby eliminating the residual charge of the previous frame to improve the display performance of the display panel.

In the data writing and threshold compensation phase t2, the second control signal SCAN2 controls the transistor M2 to be turned on, and the second control signal SCAN2 controls the transistor M4 to be turned on. The data voltage signal Vdata is written into the driving transistor M3 through the transistor M2. The transistor M4 is connected between the gate and the first electrode of the driving transistor M3, allowing it to capture the threshold voltage of the driving transistor M3 to its gate, thereby realizing compensation of the threshold voltage and self-compensating the deviation of the threshold voltage of the driving transistor M3. At the same time, the second control signal SCAN2 controls the transistor M7 to be turned on, and the anode reset signal Vref2 is transmitted to the anode of the light-emitting element D0 through the transistor M7 to reset the light-emitting element D0.

In the light-emitting phase t3, the transistors M2, M4, M5 and M7 are all turned off, the transistor M1, and the driving transistor M3 and the first light-emitting control transistor M6 are all turned on. The driving current is transmitted to the first electrode of the light-emitting element D0, and the light-emitting element D0 emits light. It should be noted that the timing diagram of FIG. 4 is merely for illustration and is not limited thereto. In some embodiments, pixel circuits with different structures may correspond to different timings.

Figure 5:
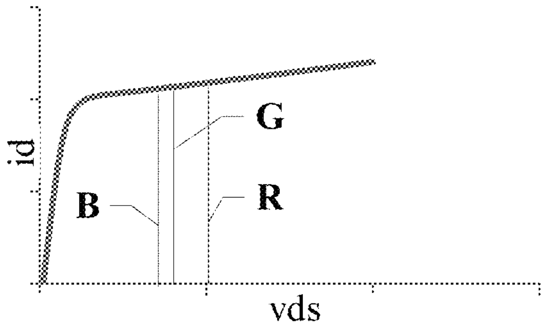
FIG. 5 is a diagram showing the voltage division of a driving transistor in pixel circuits of different light-emitting elements.

Referring continuously to FIGS. 2 and 4, in the light-emitting phase, the transistor M1, the driving transistor M3 and the first light-emitting control transistor M6 are turned on to form a light-emitting branch. In the related art, for light-emitting elements D0 of different colors, a same pixel circuit is used for driving, and different pixel circuits share the first power supply terminal PVDD and the second power supply terminal PVEE. Therefore, for the pixel circuits corresponding to different light-emitting elements D0, in the light-emitting phase, the voltage across the light-emitting branch is the same, which is PVDD-PVEE. In the light-emitting branch, the transistor M1 and the first light-emitting control transistor M6 serve as switching elements, which operate in the linear region. The Vds corresponding to the transistor M1 in different pixel circuits may be regarded as the same, and the Vds corresponding to the first light-emitting control transistor M6 in different pixel circuits may also be regarded as the same. The driving transistor M3 operates in the saturation region. Taking into account the material of the light-emitting element D0 itself, the turn-on voltages (activation voltages) corresponding to the light-emitting elements D0 of different colors are different or not completely the same. Assuming that the turn-on voltage of the light-emitting element D0 is Vd0, in the light-emitting branch, Vd0=(PVDD-PVEE)−Vds(M1)−Vds(M3)−Vds (M6). After excluding the impact of Vds(M1) and Vds(M6), when the turn-on voltage Vd0 of the light-emitting element D0 is low, its corresponding Vds(M3) will be relatively higher. Conversely, when the turn-on voltage Vd0 of the light-emitting element D0 is high, its corresponding Vds (M3) will be relatively lower. For example, referring to FIG. 5, which shows a voltage division diagram of the driving transistor M3 in the pixel circuit of different light-emitting elements D0, where R, G, and B respectively represent curves corresponding to the three light-emitting elements D0 of different colors, id represents current, and vds represents the voltage division of the driving transistor M3. There are differences in the voltage divisions of the driving transistors M3 corresponding to the three color light-emitting elements D0, among which the voltage division of the driving transistor M3 corresponding to the red light-emitting element is the largest, and the voltage division of the driving transistors M3 corresponding to the green light-emitting element and the blue light-emitting element is quite different. The voltage division difference of the driving transistors M3 will affect the uniformity of their actual output current, resulting in inconsistent current uniformity of the light-emitting elements D0 of different colors, thus causing the color cast problem.

Figure 6:
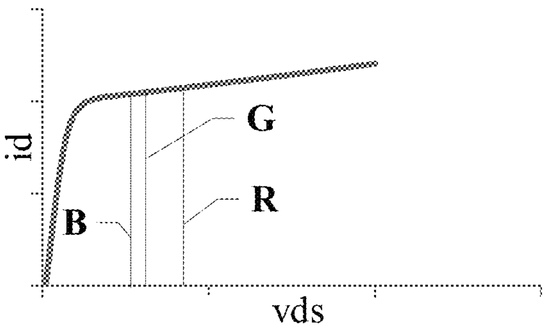
FIG. 6 is a diagram showing the voltage division of a driving transistor in pixel circuits of different light-emitting elements after considering the influence of voltage drop.

In the light-emitting phase, when the voltage of the first power supply terminal PVDD is transmitted from the first power supply terminal PVDD to the light-emitting element DO, since the transistor M1, the driving transistor M3 and the first light-emitting control transistor M6 are connected in series in the light-emitting branch, the voltage of the first power supply terminal PVDD will have a voltage drop every time it passes through a transistor. Referring to FIG. 6, which shows the voltage divisions of the driving transistors M3 in the pixel circuits of different light-emitting elements D0 after considering the influence of the voltage drop. Compared with FIG. 5, the voltage divisions are reduced, but there are still differences in the voltage divisions of the driving transistors M3 corresponding to different light-emitting elements D0. The voltage division difference of the driving transistors M3 corresponding to the red light-emitting element, the green light-emitting element and the blue light-emitting element is still large, and there is still a color cast problem. Assuming that the voltage of the first power supply terminal PVDD is 4.6 V, for the transistor M1 in the light-emitting branch, it is directly connected to the first power supply terminal PVDD. If the on-voltage of the transistor M1 is −7 V, the Vgs of the transistor M1 will reach −11.6 V, and the resistance of M1 will be very small. When the current on the light-emitting branch is constant, the voltage division of the transistor M1 will be the smallest, that is, the transistor M1 has the smallest effect on the voltage division of the light-emitting branch. The first light-emitting control transistor M6 is farthest from the first power supply terminal PVDD. After the power supply voltage is transmitted from the driving transistor M3 to the first light-emitting control transistor M6, the voltage drop is the largest, and may drop to 0. If the on-voltage of the first light-emitting control transistor M6 is −7 V, the Vgs of the first light-emitting control transistor M6 is just-7 V at this time. The resistance of the first light-emitting control transistor M6 is greater than the resistance of the transistor M1. When the current on the light-emitting branch is the same, the voltage division of the first light-emitting control transistor M6 will be very large. Therefore, when the impedance on the light-emitting branch remains unchanged, the voltage across the path from the driving transistor M3 to the first light-emitting control transistor M6 has the greatest effect on the driving current.

In the embodiments of the present disclosure, the first connection part 10 is located on the path from the driving transistor M3 to the first light-emitting control transistor M6. Therefore, the resistance of the first connection part 10 corresponding to at least two different pixel circuits is designed differently. When considering the influence of the first connection part 10, assuming that the resistance of the first connection part 10 is R, this resistance will generate an additional voltage drop V(R). At this time, the total voltage across the light-emitting branch becomes: PVDD-PVEE=Vds(M1)+Vds(M3)+Vds(M6)+Vd0+V(R), which is converted into the cross-voltage relationship of the driving transistor M3: Vds(M3)=(PVDD−PVEE)−Vds(M1)−Vds (M6)−Vd0−V(R). When the resistance of the first connection part 10 in a certain pixel circuit is large, the corresponding voltage drop V(R) will be large. This additional voltage drop will "share" part of the total power supply voltage drop, thereby reducing the voltage division Vds(M3) of the driving transistor M3. In this way, even if the voltage division Vds(M3) of the driving transistor M3 is too large due to the low turn-on voltage of the light-emitting element D0, it may be pulled back to a level similar to the voltage division Vds(M3) of the driving transistor M3 corresponding to other light-emitting elements D0 by increasing the resistance of the corresponding first connection part 10. Similarly, when the resistance of the first connection part 10 in a certain pixel circuit is small, the corresponding voltage drop V(R) will be smaller. This allows the driving transistor M3 in the pixel circuit to have more space to form the voltage division Vds(M3), thereby increasing the voltage division Vds(M3) of the driving transistor M3 in the corresponding pixel circuit. In this way, even if the higher turn-on voltage of the light-emitting element D0 corresponding to the pixel circuit has "occupied" a larger part of the voltage drop, by reducing the voltage drop of the corresponding first connection part 10 in the pixel circuit, it may be ensured that the driving transistor M3 may still obtain sufficient voltage division Vds(M3) to operate stably. At the same time, it is helpful to reduce the voltage division difference with the driving transistors M3 in other pixel circuits. In this way, by differentially designing the resistance of the corresponding first connection part 10 in the two pixel circuits, the problem of poor current uniformity caused by the voltage division difference of the pixel circuit driving transistor M3 corresponding to different light-emitting elements D0 may be improved, thereby significantly improving the current uniformity of the pixel circuit corresponding to the light-emitting elements D0 of different colors, effectively alleviating the color cast problem, and thus achieving more accurate and realistic color performance.

Referring continuously to FIGS. 1 and 3, in some embodiments, the light-emitting element D0 includes a first light-emitting element D01 and a second light-emitting element D02, and the light-emitting colors of the first light-emitting element D01 and the second light-emitting element D02 are different. The pixel circuit includes a first pixel circuit P1 and a second pixel circuit P2, the first pixel circuit P1 is electrically connected to the first light-emitting element D01, and the second pixel circuit P2 is electrically connected to the second light-emitting element D02. The turn-on voltage of the first light-emitting element D01 is less than the turn-on voltage of the second light-emitting element D02, and the resistance of the first connection part 10 in the first pixel circuit P1 is greater than the resistance of the first connection part 10 in the second pixel circuit P2.

For the first light-emitting element D01, its turn-on voltage is relatively low, and Vd0 is relatively small. In the first pixel circuit P1 corresponding to the first light-emitting element D01, in order to prevent the Vds(M3) of the driving transistor M3 from becoming too large (which may cause the current to be too high and affect the current uniformity), the embodiments of the present disclosure chooses to increase the resistance of the first connection part 10 in the first pixel circuit P1 to be greater than the resistance of the first connection part 10 in the second pixel circuit P2. The increased resistance in the first pixel circuit P1 will produce a greater voltage drop in the light-emitting branch. This additional voltage drop effectively "shares" the total voltage difference, thereby reducing the voltage division Vds(M3) of the driving transistor M3 in the first pixel circuit P1, making it closer to the voltage division Vds(M3) of the driving transistor M3 driving the second light-emitting element D02.

For the second light-emitting element D02, its turn-on voltage is relatively high, and Vd0 is relatively large, which itself will "occupy" a larger part of the voltage on the light-emitting branch. In order to ensure that the driving transistor M3 in the second pixel circuit P2 may obtain sufficient partial voltage Vds(M3) to operate stably and output the required current, in the disclosed embodiment, the resistance of the first connection part 10 in the second pixel circuit P2 is reduced. This makes the voltage drop generated by the first connection part 10 smaller, thereby leaving enough partial voltage Vds(M3) for the driving transistor M3, which is equivalent to increasing the partial voltage of the driving transistor M3 in the second pixel circuit P2.

By setting the different resistance of the first connection parts 10 in the first pixel circuit P1 and the second pixel circuit P2, the voltage division difference of the driving transistors M3 caused by the difference in the turn-on voltage of the first light-emitting element D01 and the second light-emitting element D02, which in turn causes the problem of poor current uniformity, is reduced. This is beneficial to improving the current uniformity of the first light-emitting element D01 and the second light-emitting element D02, making the brightness output more uniform, thereby alleviating the color cast problem caused by uneven brightness, and making the color of the displayed image more accurate and realistic.

When the light-emitting element D0 provided in the embodiments of the present disclosure is a light-emitting diode, the turn-on voltages of light-emitting elements D0 of different colors are not completely the same. For example, the turn-on voltage of the red light-emitting element is the lowest, for example, about 1.6~2.2 V. The turn-on voltages of the green light-emitting element and the blue light-emitting element are relatively high, for example, the turn-on voltage of the green light-emitting element is about 1.9~4 V, and the turn-on voltage of the blue light-emitting element is about 2.4~4 V. That is, the turn-on voltage of the red light-emitting element is greatly different from the turn-on voltages of the green light-emitting element and the blue light-emitting element, while the turn-on voltage of the green light-emitting element is relatively close to the turn-on voltage of the blue light-emitting element. Therefore, the first light-emitting element D01 mentioned in the above embodiments may be regarded as a red light-emitting element with a lower turn-on voltage, and the second light-emitting element D02 may be regarded as a green light-emitting element or a blue light-emitting element with a higher turn-on voltage. In this way, the current uniformity difference between the red light-emitting element and the green light-emitting element or the blue light-emitting element may be reduced, and the overall display brightness uniformity of the display panel may be improved, so it is beneficial to improve the overall display performance of the display panel.

Referring continuously to FIGS. 1 and 3, in some embodiments, the materials of the first connection parts 10 corresponding to the first pixel circuit P1 and the second pixel circuit P2 are the same, and the width of the first connection part 10 of the first pixel circuit P1 is smaller than the width of the first connection part 10 of the second pixel circuit P2, where the width direction of the first connection part 10 is perpendicular to the extension direction of the first connection part 10.

In some embodiments, the first connection parts 10 corresponding to the first pixel circuit P1 and the second pixel circuit P2 are made of the same material, and the difference in the resistance of the first connection parts 10 comes from the change in width, thus alleviating the process complexity and compatibility problems that may be caused by introducing different materials. In the disclosed embodiment, the width of the first connection part 10 of the first pixel circuit P1 is smaller than the width of the first connection part 10 of the second pixel circuit P2. When the materials, thicknesses and lengths of the first connection parts 10 in the first pixel circuit P1 and the second pixel circuit P2 are the same, the resistance of the first connection part 10 will be inversely proportional to its width. Therefore, when the width of the first connection part 10 of the first pixel circuit P1 is smaller than the width of the second pixel circuit P2, its resistance value will be greater than the resistance value of the first connection part 10 of the second pixel circuit P2. This is conducive to reducing the voltage difference of the driving transistors M3 in the first pixel circuit P1 and the second pixel circuit P2, improving the current uniformity of the first pixel circuit P1 and the second pixel circuit P2, and then improving the display uniformity. In the disclosed embodiment, since the first connection parts 10 in the first pixel circuit P1 and the second pixel circuit P2 are made of the same material, this greatly simplifies the process flow. No additional material deposition, etching or doping steps are required, which reduces production complexity and potential yield issues. Reducing process steps and material types helps reduce investment and operating costs of production equipment.

Figure 7:
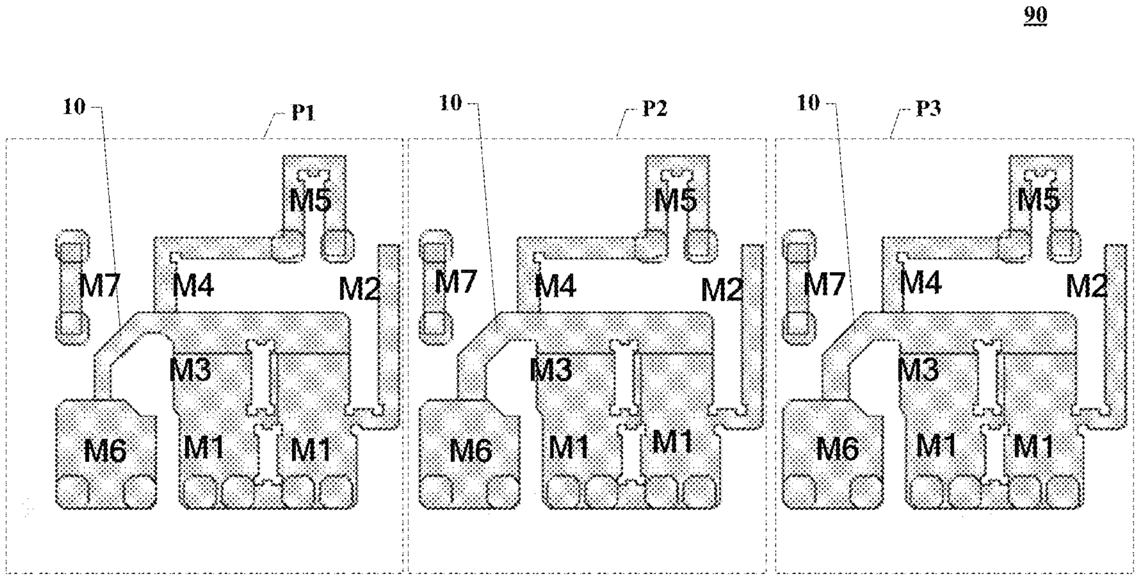
FIG. 7 is a schematic diagram showing a layout of a semiconductor layer in FIG. 3.

FIG. 7 is a schematic diagram showing the layout of the semiconductor layer in FIG. 3. Referring to FIG. 3 and FIG. 7, in some embodiments, the display panel includes a semiconductor layer 90, and the first connection parts 10 corresponding to the first pixel circuit P1 and the second pixel circuit P2 are both located in the semiconductor layer 90.

In the disclosed embodiment, a first connection part 10 is directly made in the semiconductor layer 90, which means that the first connection part 10 may exist in a size of micrometers or even nanometers, which greatly saves pixel area. This is crucial for high-resolution display panels because it may achieve a smaller pixel pitch, thereby increasing pixel density. This level of integration avoids the need to place independent resistor elements on an external circuit board or an additional layer, making the overall structure of the display panel more compact and thinner. In addition, using semiconductor manufacturing processes (such as photolithography, thin film deposition, etc.) to form the first connection part 10 may achieve extremely precise size control, so that different resistance values required in different pixel circuits may be manufactured with high precision. Moreover, the process conditions and environment of the components made on the same semiconductor layer are highly consistent, which ensures the consistency of the resistance value within the batch (between different pixels) and between batches (between different panels), thereby ensuring the uniformity of display performance.

Figure 8:
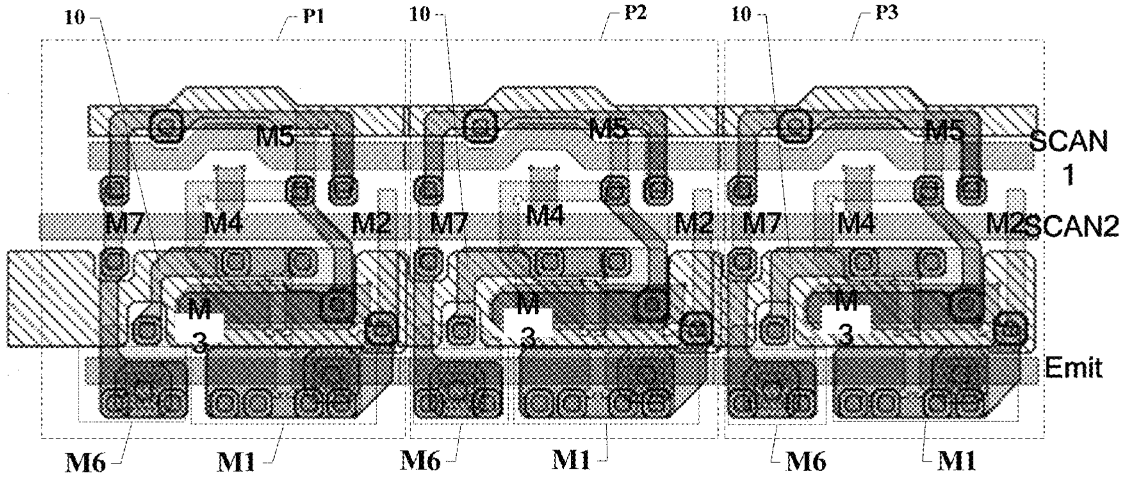
FIG. 8 is a schematic diagram showing a layout of another pixel circuit in accordance with an embodiment of the present disclosure.

When the first connection parts 10 corresponding to the first pixel circuit P1 and the second pixel circuit P2 are located in the same layer, the embodiment of FIG. 7 is described by taking the first connection parts 10 corresponding to the first pixel circuit P1 and the second pixel circuit P2 as an example, in which both are located in the semiconductor layer 90, but the present disclosure is not limited thereto. In some embodiments, the first connection parts 10 in the first pixel circuit P1 and the second pixel circuit P2 may also be located in other film layers, for example, in a same metal layer. For example, refer to FIG. 8, which is a schematic diagram of the layout of another pixel circuit in accordance with an embodiment of the present disclosure. When the first connection parts 10 are located in the metal layer, the first connection parts 10 may be electrically connected to the driving transistor M3 and the first light-emitting control transistor M6 through a respective connection hole.

Figure 9:
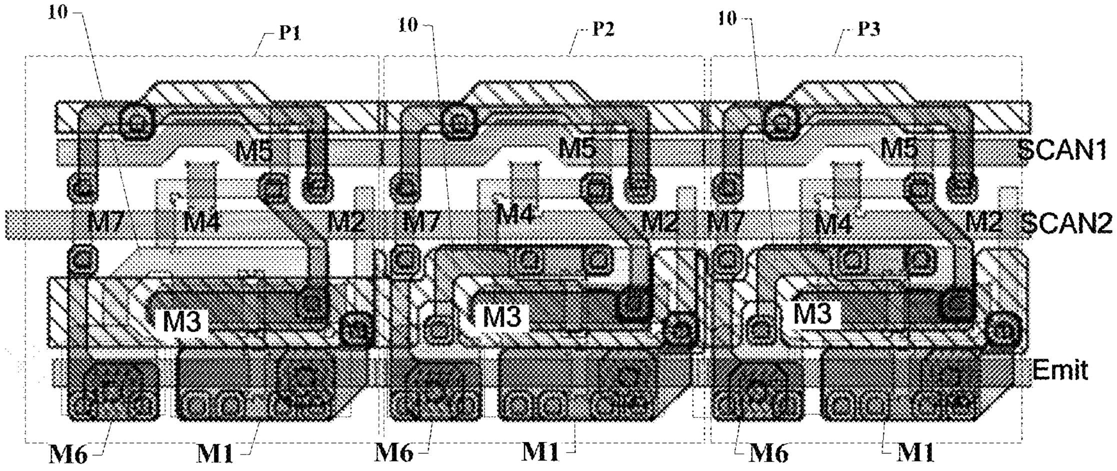
FIG. 9 is a schematic diagram showing a layout of another pixel circuit in accordance with an embodiment of the present disclosure.
Figure 10:
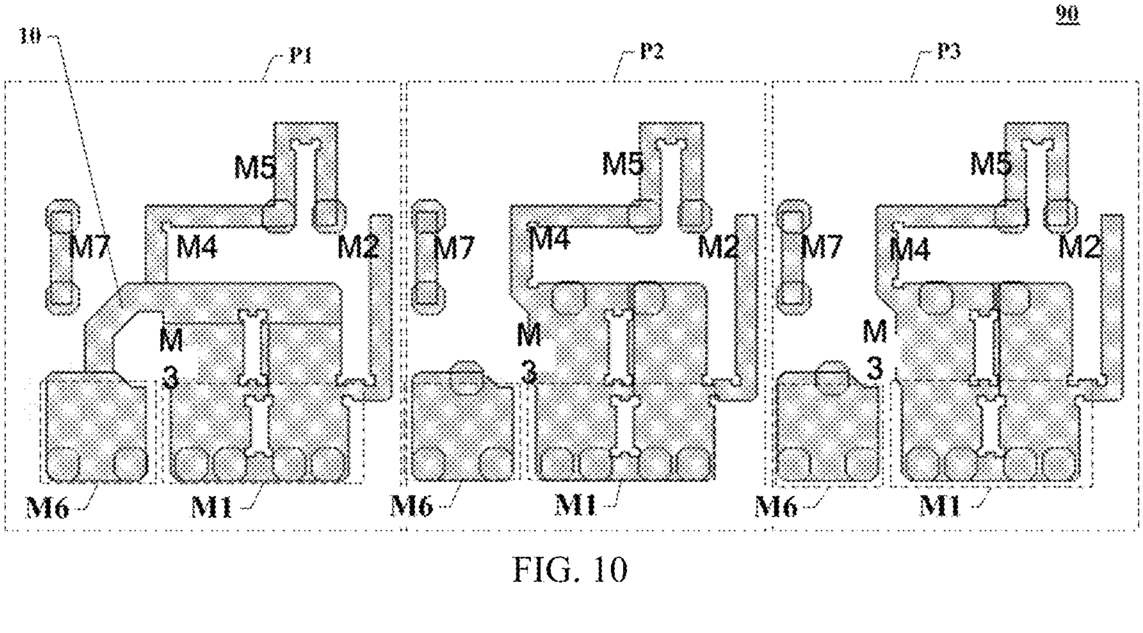
FIG. 10 is a schematic diagram showing a layout of a semiconductor layer in FIG. 9.

The above embodiments illustrate the solution that the first connection parts 10 in the first pixel circuit P1 and the second pixel circuit P2 are made of the same material. In some embodiments, the first connection parts 10 in the first pixel circuit P1 and the second pixel circuit P2 may also be made of different materials. For example, referring to FIGS. 9 and 10. FIG. 9 shows a schematic diagram of the layout of another pixel circuit in accordance with an embodiment of the present disclosure, and FIG. 10 shows a schematic diagram of the layout of the semiconductor layer 90 in FIG. 9. In some embodiments, the materials of the first connection parts 10 corresponding to the first pixel circuit P1 and the second pixel circuit P2 are different, and the sheet resistance of the first connection part 10 in the first pixel circuit P1 is greater than the sheet resistance of the first connection part 10 in the second pixel circuit P2.

The first connection parts have different sheet resistance and different resistivities. By selecting materials with different resistivities, the resistance of the first connection parts 10 may be easily differentiated. For example, a material with a higher resistivity is selected for a pixel circuit that requires a larger resistance, and a material with a lower resistivity is selected for a pixel circuit that requires a smaller resistance. In the present disclosure, "sheet resistance" is a parameter that characterizes the resistivity of a thin film material, and its value is related to the material itself and the thickness of the film. The sheet resistance of the first connection part 10 in the first pixel circuit P1 is greater than that in the second pixel circuit P2, indicating that the resistance value per unit area of the first connection part 10 in the first pixel circuit P1 is larger, so that under the same geometric size, its total resistance R will also be larger. When the first connection part 10 in the first pixel circuit P1 uses a material with a larger sheet resistance, its resistance R will increase accordingly, and the generated additional voltage drop V(R) will increase. According to the formula Vds(M3)=(PVDD−PVEE)−Vds(M1)−Vds(M6)−Vd0−V(R), a larger V(R) will cause Vds(M3) to decrease. This is particularly applicable to the first pixel circuit P1 corresponding to the first light-emitting element D01 with a lower turn-on voltage. By reducing Vds(M3), it is possible to avoid the Vds(M3) being too large due to the low turn-on voltage of the first light-emitting element D01, thereby pulling Vds(M3) back to a level similar to that of other pixel circuits. When the first connection part 10 in the second pixel circuit P2 uses a material with a smaller sheet resistance, its resistance R will be reduced accordingly, and the generated additional voltage drop V(R) will be reduced. This will increase Vds(M3). This is particularly applicable to the second pixel circuit P2 corresponding to the second light-emitting element D02 with a higher turn-on voltage. By increasing Vds(M3), it is possible to mitigate the problem of Vds(M3) being too small due to the high turn-on voltage of the second light-emitting element D02, and it is also beneficial to reduce the problem of poor current uniformity caused by the large difference in Vds(M3) between the first pixel circuit P1 and the second pixel circuit P2. This then helps improve the current uniformity of the first pixel circuit P1 and the second pixel circuit P2, and improve the overall display performance.

In the disclosed embodiment, different materials are used to control the sheet resistance of the first connection parts 10 in the first pixel circuit P1 and the second pixel circuit P2. By making differentiation at the material level, the manufacturing accuracy and consistency problems that may be caused by adjusting the resistance by simply changing the geometric dimensions may be avoided. This is conducive to improving the current uniformity between different pixel circuits, thereby improving the production yield and image quality of the display panel.

Referring continuously to FIG. 9 and FIG. 10, in some embodiments, the first connection part 10 of the first pixel circuit P1 includes a semiconductor material, and the first connection part 10 of the second pixel circuit P2 includes a metal material.

The resistivity of semiconductor materials (such as amorphous silicon, polycrystalline silicon, oxide semiconductors, etc.) is usually much higher than that of metal materials. By controlling the doping concentration, film thickness and annealing process, semiconductor materials may achieve a very wide range of resistivity adjustment, so that high sheet resistance may be easily obtained, thereby meeting the high resistance requirement of the first connection part 10 in the first pixel circuit P1. Even if the turn-on voltage corresponding to the first light-emitting element D01 is extremely low, and a very large additional voltage drop V(R) is required to "share" the excessive voltage division of the driving transistor M3, the semiconductor material may also provide the required huge resistance value. Metal materials (such as copper, aluminum, molybdenum, titanium, etc.) have extremely low resistivity. Selecting a metal material as the first connection part 10 in the second pixel circuit P2 may ensure that the resistance of the first connection part 10 of the second pixel circuit P2 is extremely small, and may even be regarded as a short circuit (relative to the first connection part 10 of the first pixel circuit P1), so that the additional voltage drop V(R) generated by it may be ignored. This ensures that when the turn-on voltage of the second light-emitting element D02 is high, the driving transistor M3 may obtain sufficient voltage division space to operate stably.

In addition, considering that the deposition and patterning processes of semiconductor materials and metal materials are very mature and commonly used technologies in semiconductor display manufacturing, integrating these two materials in the pixel circuit to form the first connection parts 10 in the first pixel circuit P1 and the second pixel circuit P2 has high process compatibility, which is conducive to mass production and reduces manufacturing costs. By selecting suitable semiconductor and metal materials, it may be ensured that the first connection parts 10 have good electrical stability and reliability during the long-term operation of the display, avoiding resistance value drift that causes a decrease in current uniformity, thereby ensuring long-term stability of display performance.

Figure 11:
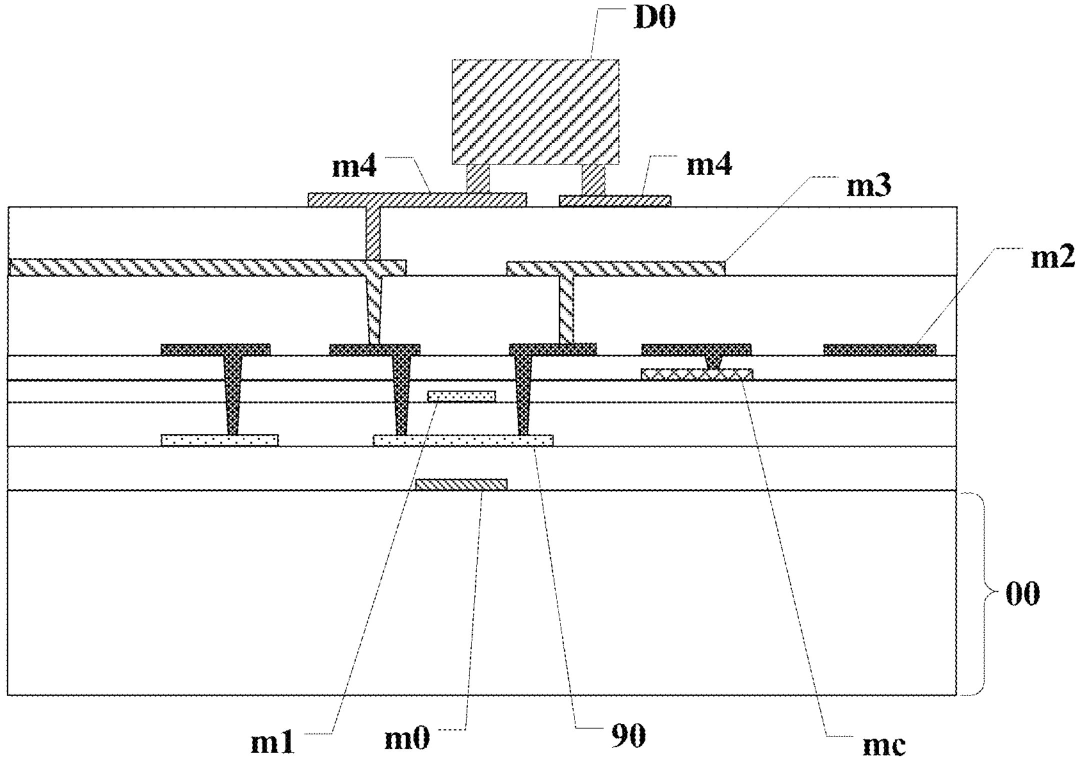
FIG. 11 is a schematic diagram of film layers of a display panel in accordance with an embodiment of the present disclosure.

FIG. 11 is a schematic diagram of film layers of a display panel in accordance with an embodiment of the present disclosure, where the display panel includes a semiconductor layer 90, a first metal layer m1, a capacitor metal layer mc, a second metal layer m2, a third metal layer m3, and a fourth metal layer m4, which are arranged on one side of a substrate 00, and adjacent metal layers are isolated by an insulating layer. Optionally, the semiconductor layer 90 is located between the first metal layer m1 and the substrate 00, and the capacitor metal layer mc is located between the first metal layer m1 and the second metal layer m2. The first metal layer m1 is located on the side of the capacitor metal layer mc facing the substrate 00, the second metal layer m2 is located on the side of the capacitor metal layer mc facing away from the substrate 00, the third metal layer m3 is located on the side of the second metal layer m2 facing away from the substrate 00, and the fourth metal layer m4 is located on the side of the third metal layer m3 facing away from the substrate 00. When the pixel circuit of the display panel includes a plurality of transistors, the gate of a transistor may be located at the first metal layer m1, and the source and the drain of the transistor may be located at the second metal layer m2. The first metal layer m1 and the second metal layer m2 may also be provided with a plurality of signal lines. The third metal layer m3 and the capacitor metal layer mc may also be used for laying out the signal lines. The capacitor metal layer mc is also used to overlap with the second metal layer m2 or the first metal layer m1 to form storage capacitors in the pixel circuit. The fourth metal layer m4 may form a pad connected to the light-emitting element D0. Optionally, the display panel may further include an auxiliary metal layer m0 disposed on the side of the first metal layer m1 facing the substrate 00, where the auxiliary metal layer m0 overlaps with the channel region of a transistor to play a light-shielding role to prevent light from affecting the transistor.

Referring to FIGS. 9 to 11, in some embodiments, the display panel includes a semiconductor layer 90 and at least one metal layer (for example, the first metal layer m1, the second metal layer m2, the third metal layer m3 and the fourth metal layer m4 of the aforementioned embodiment), and the first connection part 10 of the first pixel circuit P1 is located in the semiconductor layer 90, and the first connection part 10 of the second pixel circuit P2 is located in the metal layer.

Placing the first connection part 10 of the first pixel circuit P1 in the semiconductor layer 90 in the display panel naturally obtains a high resistance value, and placing the first connection part 10 of the second pixel circuit P2 in the metal layer in the display panel may obtain an extremely low resistance value. In the manufacturing process of the display panel, the semiconductor layer and the multi-metal layers are standard and mature process steps. Integrating the first connection part 10 into these existing layers does not require additional complex material deposition or etching steps, which improves process compatibility, reduces manufacturing costs and complexity, and is conducive to large-scale mass production.

In the disclosed embodiment, for the first pixel circuit P1, since the corresponding first light-emitting element D01 has a low turn-on voltage and a small voltage drop, the driving transistor M3 may have an excessive voltage division. By setting the first connection part 10 in the first pixel circuit P1 in the semiconductor layer, its high resistance will generate a large additional voltage drop V(R), effectively "sharing" a part of the total power supply voltage drop, thereby pulling down the voltage division Vds(M3) of the driving transistor M3 to a level similar to the voltage division of the driving transistor M3 corresponding to the light-emitting element with a higher turn-on voltage. For the second pixel circuit P2, since the corresponding second light-emitting element D02 has a high turn-on voltage and a large voltage drop, the voltage division space left for the driving transistor M3 is small. By placing the first connection part 10 in the second pixel circuit P2 in the metal layer, the additional voltage drop V(R) generated by its extremely low resistance may be ignored, and the voltage division space available to the driving transistor M3 is retained to the maximum extent, ensuring that the driving transistor M3 may obtain sufficient Vds(M3) for stable operation even when the turn-on voltage of the light-emitting element D0 is high.

In the embodiments of the present disclosure, the first connection part 10 in the first pixel circuit P1 is disposed in the semiconductor layer, and the first connection part 10 in the second pixel circuit P2 is disposed in the metal layer. Optionally, the first connection part 10 in the second pixel circuit P2 may be disposed in at least one of the first metal layer m1, the second metal layer m2, and the third metal layer m3, for example, in the second metal layer m2. The material of the semiconductor layer is, for example, p-Si, with a sheet resistance of 3000-4000 Ω/sq, and the material of the second metal layer includes A1, with a sheet resistance of approximately less than 0.005 Ω/sq.

In some embodiments, the sheet resistance of the first connection part 10 in the first pixel circuit P1 is R1, and the sheet resistance of the first connection part 10 in the second pixel circuit P2 is R2, R1=K*R2, where $K \geq 10^5$. When the turn-on voltage of the light-emitting element D0 in a pixel circuit (such as the first pixel circuit P1) is extremely low, the voltage drop it "occupies" is very small, resulting in an abnormally large voltage drop Vds(M3) of the driving transistor M3. In order to pull it back to a level similar to that of other pixel circuits, a very large additional voltage drop V(R) is required to "share" this part of the excessively high Vds(M3). In the disclosed embodiment, R1=K×R2 and $K \geq 10^5$. The design enables the first connection part 10 of the first pixel circuit P1 to provide a voltage drop V(R) far exceeding that of conventional resistors. This ensures that even when the first light-emitting element D01 has an extremely low turn-on voltage, the Vds(M3) of the driving transistor M3 may be effectively reduced by the ultra-large resistance of R1, so that it may match the voltage division of the driving transistor M3 in other pixel circuits. On the contrary, when the turn-on voltage of the light-emitting element DO in a certain pixel circuit (for example, the second pixel circuit P2) is high, it has "occupied" most of the voltage drop, leaving less voltage division space for the driving transistor M3. At this time, the resistance of the first connection part 10 (square resistor R2) of the second pixel circuit P2 is relatively very small, and may even be regarded as a near short circuit (relative to R1), so that the additional voltage drop V(R) generated by it may be ignored. This ensures that the driving transistor M3 may obtain the maximum possible voltage drop space, ensures that it may still operate stably when the turn-on voltage of the light-emitting element is high, and avoids its Vds(M3) being too small to cause insufficient current.

Optionally, $K \geq 5 \times 10^5$.

In some embodiments, R2≤1 Ω/sq. At this time, the first connection part 10 in the second pixel circuit P2 will have a very low resistance, and even if the current is large, the additional voltage drop V(R) generated by the first connection part 10 will be very small, or even negligible. In this way, the first connection part 10 in the second pixel circuit P2 is effectively prevented from "seizing" too much power supply voltage drop, and the further reduction of the voltage division of the driving transistor M3 by the first connection part 10 is effectively reduced, thereby ensuring that the driving transistor M3 may obtain the maximum voltage division Vds(M3) required for its normal operation.

Optionally, R2≤0.5 Ω/sq.

Figure 12:
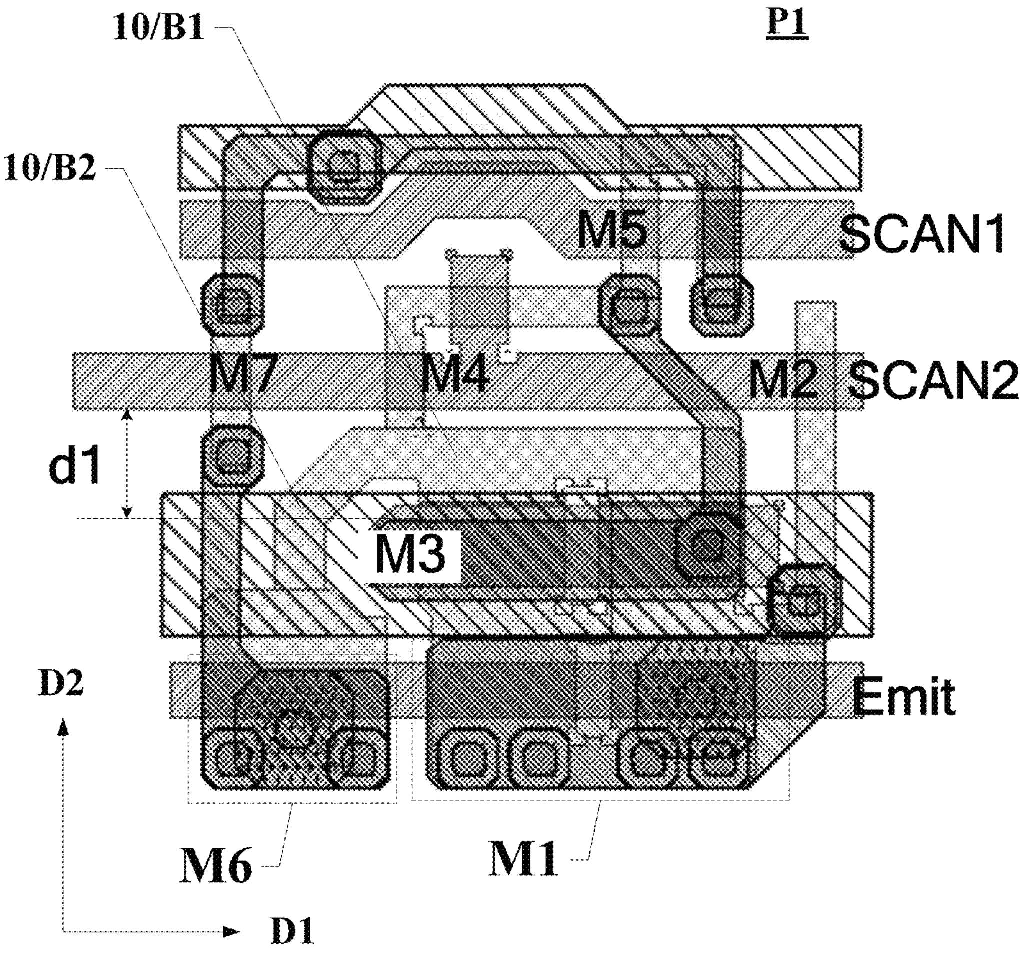
FIG. 12 is a schematic diagram showing a layout of a first pixel circuit in accordance with an embodiment of the present disclosure.
Figure 13:
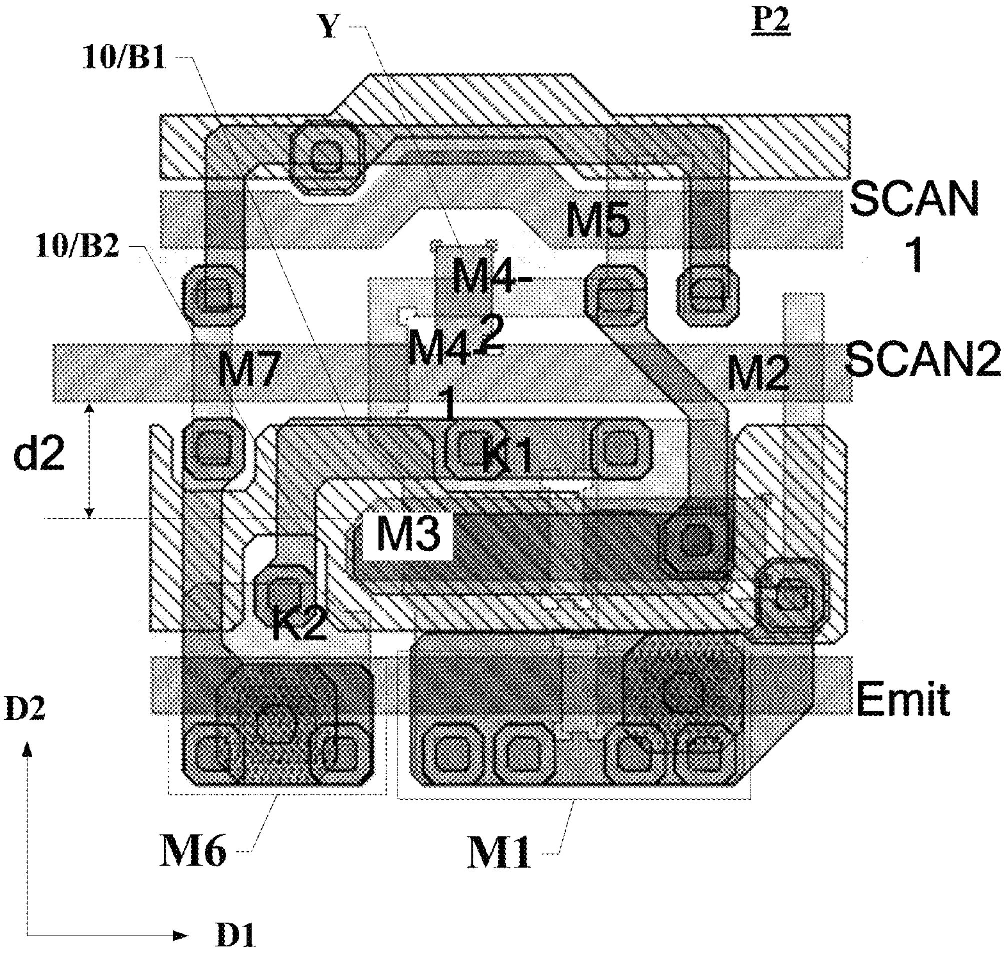
FIG. 13 is a schematic diagram showing a layout of a second pixel circuit in accordance with an embodiment of the present disclosure.

FIG. 12 is a schematic diagram of the layout of the first pixel circuit P1 in accordance with an embodiment of the present disclosure, and FIG. 13 is a schematic diagram of the layout of the second pixel circuit P2 in accordance with an embodiment of the present disclosure. Referring to FIGS. 9, 12 and 13, in some embodiments, the first connection part 10 includes a first sub-portion B1 and a second sub-portion B2 that are connected to each other, where the first sub-portion B1 extends along a first direction D1, the second sub-portion B2 extends along a second direction D2, and the first direction D1 and the second direction D2 intersect. The first sub-portion B1 is located on the side of the gate of the driving transistor M3 along the second direction D2, and the second sub-portion B2 is located on the side of the gate of the driving transistor M3 along the first direction D1.

The first connection part 10 corresponding to the second pixel circuit P2 includes a metal material. In the first connection part 10 corresponding to the second pixel circuit P2, the first sub-portion B1 is connected to the semiconductor layer of the driving transistor M3 through a first connection hole K1, and the second sub-portion B2 is connected to the semiconductor layer of the first light-emitting control transistor M6 through a second connection hole K2.

The first connection part 10 corresponding to the first pixel circuit P1 includes a semiconductor material. In the first connection part 10 corresponding to the first pixel circuit P1, the first sub-portion B1 and the second sub-portion B2 are arranged on the same layer as the semiconductor layer of the driving transistor M3 and the first light-emitting control transistor M6.

In the embodiments of the present disclosure, the first connection part 10 is composed of a first sub-portion B1 extending along a first direction D1 and a second sub-portion B2 extending along a second direction D2, and the first direction D1 and the second direction D2 intersect (for example, in an L shape). This structure facilitates simultaneous connection to the driving transistor M3 and the first light-emitting control transistor M6 in a compact pixel space. In addition, the first connection part 10 adopts an L-shaped structure, which may provide a resistance path of a certain length in a limited space, providing flexibility for precise adjustment of the resistance value.

When the first connection part 10 of the second pixel circuit P2 is made of metal material, the metal material has an extremely low resistivity, ensuring that the overall resistance of the first connection part 10 is extremely small, and the generated additional voltage drop V(R) may be ignored. When the first connection part 10 is made of a metal material, the first connection part 10 may be connected to the driving transistor M3 and the first light-emitting control transistor M6 through a through hole(s), thus ensuring that the signal transmission path is short and the resistance loss is minimized.

When the first connection part 10 of the first pixel circuit P1 is made of semiconductor material, the first connection part 10 is arranged in the same layer as the semiconductor layer of the driving transistor M3 and the first light-emitting control transistor M6. In this way, the semiconductor layer of the first connection part 10, the driving transistor M3 and the first light-emitting control transistor M6 may be patterned and formed in the same layer, which may significantly simplify the manufacturing process. This avoids additional interlayer connection steps (such as through holes), reduces process complexity and potential defects. With the same-layer arrangement, the thickness and doping uniformity of the semiconductor material are easier to accurately control, which helps ensure the accuracy and uniformity of the resistance of the first connection part 10, thereby achieving more accurate voltage compensation. In addition, the same-layer integration may reduce interlayer stress, connection resistance and the risk of connection failure, thereby improving the long-term reliability of the entire pixel circuit.

Referring to FIG. 12 and FIG. 13, in some embodiments, the length of the second sub-portion B2 of the second pixel circuit P2 is greater than the length of the second sub-portion B2 of the first pixel circuit P1.

In the embodiments of the present disclosure, the first connection part 10 of the second pixel circuit P2 is made of a metal material and is connected to the driving transistor M3 and the first light-emitting control transistor M6 through a connection hole(s). In semiconductor manufacturing, the resistance contribution of the connection hole mainly comes from the contact resistance. In order to ensure extremely low connection resistance, it is usually necessary to increase the number or size of the connection holes to increase the contact area, thereby reducing the total contact resistance. Therefore, in the embodiments of the present disclosure, the length of the second sub-portion B2 of the second pixel circuit P2 is greater than the length of the second sub-portion B2 of the first pixel circuit P1, and thus more or larger connection holes may be accommodated. Increasing the length of the second sub-portion B2 may provide a larger space for arranging the connection holes to ensure a low-resistance and reliable connection with the driving transistor M3 or the first light-emitting control transistor M6. More connection holes or a larger connection area may significantly reduce the contact resistance between the metal layer and the semiconductor layer, thereby ensuring that the total resistance of the entire first connection part 10 of the second pixel circuit P2 and the connection holes is maintained at an extremely low level, so that the additional voltage drop V(R) generated by the first connection part 10 of the second pixel circuit P2 is minimized, thereby maximizing the retention of the voltage division Vds(M3) of the driving transistor M3.

Referring continuously to FIGS. 9, 12 and 13, in some embodiments, the display panel includes a first scan line SCAN1 and a second scan line SCAN2 extending along the first direction D1, the first scan line SCAN1 is configured to provide a first scan signal to the pixel circuit, and the second scan line SCAN2 is configured to provide a second scan signal to the pixel circuit. In the corresponding area of the pixel circuit, along the second direction D2, the second scan line SCAN2 is located between the first scan line SCAN1 and the gate of the driving transistor M3. In the corresponding area of the first pixel circuit P1, along the second direction D2, the distance between the second scan line SCAN2 and the gate of the driving transistor M3 is d1, and in the corresponding area of the second pixel circuit P2, along the second direction D2, the distance between the second scan line SCAN2 and the gate of the driving transistor M3 is d2, where, d1<d2.

When the first connection part 10 in the second pixel circuit P2 is made of a metal material, the first connection part 10 needs to be connected to the driving transistor M3 and the first light-emitting control transistor M6 through the connection hole(s). Therefore, in the embodiments of the present disclosure, d2>d1 is set, and the increase of d2 may provide the necessary space for the first connection part 10 located in the metal layer to be connected to the driving transistor M3 through the connection hole. In the second pixel circuit P2, the larger spacing between the second scan line SCAN2 and the gate of the driving transistor M3 may accommodate a sufficient size and number of connection holes, and provide sufficient process margin to cope with the alignment error that may exist in the manufacturing process, thereby ensuring the successful production and reliable connection of the connection hole(s). Considering that the first connection part 10 in the second pixel circuit P2 requires an extremely low resistance, to achieve this purpose, not only the first connection part 10 itself needs to have a low resistance, but also the contact resistance of the connection hole(s) needs to be extremely low. Therefore, by increasing the distance between the second scan line SCAN2 and the gate of the driving transistor M3 in the second pixel circuit P2, it is helpful to increase the number and size of the connection holes, thereby achieving a low resistance of the connection holes.

In the first pixel circuit P1, the first connection part 10 is made of a semiconductor material and is arranged in the same layer as the semiconductor layer of the driving transistor M3 and the first light-emitting control transistor M6, and no additional connection holes are required for connection. Therefore, the spacing d1 between the second scan line SCAN2 in the first pixel circuit P1 and the gate of the driving transistor M3 may be kept relatively small. This differentiated design of d1 avoids unnecessary waste of space. In areas where no connection holes are required, maintaining a compact spacing helps maximize the pixel aperture ratio, improve display resolution and brightness efficiency, or provide more space for other functional components in the pixel.

Optionally, d1 is 5-6 μm or even smaller, and d2 is 5.5-7 μm or larger.

Referring to FIGS. 2 and 13, in some embodiments, the display panel further includes an extension portion Y electrically connected to the second scan line SCAN2. Optionally, the extension portion Y is arranged in the same layer as the second scan line SCAN2. The extension portion Y is located between the first scan line SCAN1 and the second scan line SCAN2. The pixel circuit further includes a threshold compensation transistor M4. The first electrode of the threshold compensation transistor M4 is electrically connected to the first connection part 10, the second electrode is connected to the gate of the driving transistor M3, and the control terminal of the threshold compensation transistor M4 is electrically connected to the second scan line SCAN2. The threshold compensation transistor M4 includes a first sub-transistor M4-1 and a second sub-transistor M4-2 connected in series. The gate of the first sub-transistor M4-1 overlaps with the second scan line SCAN2, and the gate of the second sub-transistor M4-2 overlaps with the extension portion Y.

Considering that the threshold voltage (Vth) of the driving transistor M3 will drift due to long-term operation, temperature changes, process unevenness and other factors. Vth drift will cause the driving current of the driving transistor M3 to be unstable, which will cause uneven pixel brightness and reduced display quality. The threshold compensation transistor M4 stores the threshold voltage Vth information of the driving transistor M3 during the data writing and threshold compensation phases, and eliminates its influence on the current in the subsequent driving phase, so that the driving current of the driving transistor M3 is merely related to the data voltage and is not affected by the threshold voltage drift.

In the disclosed embodiment, the threshold compensation transistor M4 includes a first sub-transistor M4-1 and a second sub-transistor M4-2 connected in series, which has a stronger threshold voltage compensation capability than a simple single transistor compensation scheme. This may more effectively eliminate the influence of the threshold voltage drift of the driving transistor M3 on the display brightness, thereby significantly improving the brightness uniformity, grayscale performance and color accuracy of the display panel, and eliminating the problem of screen "burn-in" or uneven brightness caused by aging. In addition, when the first sub-transistor M4-1 and the second sub-transistor M4-2 connected in series are turned off, they may be regarded as two high resistors connected in series, and the overall leakage current of the two transistors connected in series will be much smaller than the leakage current of a single transistor, thereby effectively reducing the leakage of the threshold compensation transistor to the gate of the driving transistor M3. The smaller the leakage current, the more stable the voltage stored on the gate of the driving transistor M3, thereby ensuring the accuracy of the threshold voltage compensation and the consistency of the compensation between different pixels, which is conducive to improving the overall display brightness and color uniformity.

In addition, in the disclosed embodiment, the extension portion Y extends from the second scan line SCAN2, which may avoid independently arranging a control line for the gate of the second sub-transistor M4-2 in a narrow pixel area, thereby helping save layout space. At the same time, the gates of the first sub-transistor M4-1 and the second sub-transistor M4-2 are both controlled by the signal on the second scan line SCAN2, ensuring the coordinated operation of the first sub-transistor M4-1 and the second sub-transistor M4-2 during the threshold compensation operation.

Referring to FIGS. 1, 3 and 9, in some embodiments, the light-emitting element DO further includes a third light-emitting element D03, and the light-emitting color of the third light-emitting element D03 is different from the light-emitting color of the first light-emitting element D01 and the second light-emitting element D02. The pixel circuit P further includes a third pixel circuit P3, and the third light-emitting element D03 is electrically connected to the third pixel circuit P3. The turn-on voltage of the second light-emitting element D02 is less than or equal to the turn-on voltage of the third light-emitting element D03, and the resistance R2 of the first connection part 10 in the second pixel circuit P2 is greater than or equal to the resistance R3 of the first connection part 10 in the third pixel circuit P3. When the display panel includes the third light-emitting element D03, it is conducive to achieving a full-color display of the display panel.

In some embodiments, the first light-emitting element D01 is a red light-emitting element, the second light-emitting element D02 is one of a green light-emitting element and a blue light-emitting element, and the third light-emitting element D03 is the other of a green light-emitting element and a blue light-emitting element. For example, the first light-emitting element D01 is a red light-emitting element, the second light-emitting element D02 is a green light-emitting element, and the third light-emitting element D03 is a blue light-emitting element. Alternatively, the first light-emitting element D01 is a red light-emitting element, the second light-emitting element D02 is a blue light-emitting element, and the third light-emitting element D03 is a green light-emitting element.

According to the difference in the turn-on voltage, the resistance relationship of the first connection parts 10 in the pixel circuits corresponding to the three light-emitting elements D0 can be set to R1>R2≥R3. For the green light-emitting element and the blue light-emitting element, since the difference in the turn-on voltage between the two is small, R2=R3 may be set, so that there is no need to differentiate the pixel circuits corresponding to the green light-emitting element and the blue light-emitting element. Just the resistance of the first connection part 10 in the pixel circuit corresponding to the first light-emitting element D01 needs to be adjusted. This is conducive to simplifying the overall manufacturing difficulty of the display panel, and is conducive to improving the uniformity of display brightness and improving the color cast problem while improving production efficiency.

Apparently, in order to achieve refined control of current uniformity, the embodiments of the present disclosure may also differentiate the designs of R2 and R3 according to the difference in turn-on voltages between the second light-emitting element D02 and the third light-emitting element D03. For example, when the turn-on voltage of the second light-emitting element D02 is less than the turn-on voltage of the third light-emitting element D03, R2>R3 may be set to further reduce the current uniformity difference between the second light-emitting element D02 and the third light-emitting element D03.

Referring continuously to FIGS. 1 and 9, in some embodiments, the light-emitting element D0 includes a first light-emitting element D01, a second light-emitting element D02 and a third light-emitting element D03. The first light-emitting element D01 is a red light-emitting element, the second light-emitting element D02 is one of a green light-emitting element and a blue light-emitting element, and the third light-emitting element D03 is the other of the green light-emitting element and the blue light-emitting element. The pixel circuit includes a first pixel circuit P1, a second pixel circuit P2 and a third pixel circuit P3. The first light-emitting element D01 is electrically connected to the first pixel circuit P1, the second light-emitting element D02 is electrically connected to the second pixel circuit P2, and the third light-emitting element D03 is electrically connected to the third pixel circuit P3.

The turn-on voltage of the first light-emitting element D01 is less than the turn-on voltage of the second light-emitting element D02, and the turn-on voltage of the second light-emitting element D02 is less than or equal to the turn-on voltage of the third light-emitting element D03. The first connection part 10 of the first pixel circuit P1 includes a semiconductor material, and the first connection parts 10 of the second pixel circuit P2 and the third pixel circuit P3 include a metal material.

For the first light-emitting element D01 with the lowest turn-on voltage, in the corresponding first pixel circuit P1, the driving transistor M3 will have the largest voltage division Vds(M3) without compensation. In the disclosed embodiment, the first connection part 10 in the first pixel circuit P1 is made of semiconductor material, which has a high resistivity and may provide an extremely high resistance R1. This high resistance R1 will produce a significant additional voltage drop V(R), effectively "sharing" and significantly reducing the excessive voltage division Vds (M3) of M3. This is crucial for pulling the driving current of the red pixel back to a level consistent with that of other color pixels, alleviating color cast caused by excessive saturation of red or excessive brightness.

For the second light-emitting element D02 and the third light-emitting element D03 with higher turn-on voltage, the voltage division of the light-emitting element D0 itself is relatively large, and in the corresponding pixel circuit, the voltage division space left for the driving transistor M3 is relatively small. Therefore, when the first connection parts 10 in the second pixel circuit P2 and the third pixel circuit P3 are made of a metal material, since the metal material has a lower resistivity, a first connection part 10 with a lower resistance may be provided. The additional voltage drop V(R) generated by the first connection part 10 with extremely low resistance R2 and R3 may be ignored, thereby maximally retaining the voltage division Vds(M3) that may be obtained by the driving transistor M3 in the second pixel circuit P2 or the third pixel circuit P3. This is crucial to ensure that the driving transistor M3 may still obtain sufficient voltage division to operate stably and output sufficient current when driving the second light-emitting element D02 and the third light-emitting element D03 with high turn-on voltage, thereby alleviating insufficient brightness or unstable driving.

In addition to balancing the current of the pixel circuits corresponding to the light-emitting elements D0 with different turn-on voltages by adjusting the resistance of the first connection parts 10 in the light-emitting branch, the current uniformity of different pixel circuits may be further improved by other methods. For example, in some embodiments, in the first pixel circuit P1, the channel width-to-length ratio of the driving transistor M3 is A1, and the channel width-to-length ratio of the first light-emitting control transistor M6 is K1; in the second pixel circuit P2, the channel width-to-length ratio of the driving transistor M3 is A2, and the channel width-to-length ratio of the first light-emitting control transistor M6 is K2, where A1/K1>A2/K2.

For the first pixel circuit P1 with a lower first turn-on voltage, the voltage division Vds(M3) of the driving transistor M3 therein will be the highest when not compensated. In the embodiments of the present disclosure, by setting A1/K1 relatively large, for example, the channel width-to-length ratio A1 of the driving transistor M3 corresponding to the first light-emitting element D01 is increased, or the channel width-to-length ratio K1 of the first light-emitting control transistor M6 is reduced. When the channel width-to-length ratio of the driving transistor M3 corresponding to the first light-emitting element D01 increases, the driving capability of the driving transistor M3 is enhanced. To achieve the same target current, the voltage division Vds (M3) of the driving transistor M3 will decrease. When the channel width-to-length ratio of the first light-emitting control transistor M6 decreases, the impedance of the first light-emitting control transistor M6 increases, and the voltage division Vds(M6) increases, which may also reduce the voltage division Vds(M3) of the driving transistor M3. Therefore, by setting A1/K1>A2/K2, the voltage division Vds(M3) of the driving transistor M3 may be reduced, which is equivalent to reducing the voltage division Vds (M3) of the driving transistor M3 in the pixel circuit corresponding to the first light-emitting element D01 with a smaller turn-on voltage. This thus facilitates the reduction of the voltage division difference corresponding to the driving transistors M3 in the pixel circuits corresponding to the first light-emitting element D01 and the second light-emitting element D02, so that the first light-emitting element D01 and the second light-emitting element D02 may achieve closer actual light-emitting current under the same grayscale driving signal. This significantly improves the current uniformity of the first light-emitting element D01 and the second light-emitting element D02, and effectively alleviates the color cast problem. This design works in conjunction with the high resistance of the first connection part 10 in the first pixel circuit P1, and the high-resistance first connection part 10 will "share" part of the voltage, reducing the voltage division Vds(M3) of the driving transistor M3. If A1/K1 is relatively large, the voltage division Vds(M3) of the driving transistor M3 in the first pixel circuit P1 may be further increased, thereby significantly improving the current uniformity of the first light-emitting element D01 and the second light-emitting element D02, and effectively alleviating the color cast problem.

It should be noted that when the turn-on voltage difference between the first light-emitting element D01 and the second light-emitting element D02 is relatively large, the voltage division difference of the driving transistors M3 in the first pixel circuit P1 and the second pixel circuit P2 may be reduced by simultaneously and differentially designing the resistance of the first connection part 10 and the ratio of the driving transistor M3 to the first light-emitting control transistor M6, so as to better improve the current uniformity and display uniformity.

Referring to FIGS. 2 and 9, in some embodiments, the pixel circuit also includes a second light-emitting control transistor M1, which is connected between the first electrode of the driving transistor M3 and the first power supply terminal PVDD. In the area where the pixel circuit is located, the first light-emitting control transistor M6 and the second light-emitting control transistor M1 are located on the same side of the gate of the driving transistor M3 along the second direction D2.

The first light-emitting control transistor M6 and the second light-emitting control transistor M1 are concentrated on one side of the gate of the driving transistor M3, rather than being dispersed in different areas of the pixel circuit, so that the overall layout of the pixel is more regular and compact. This centralized layout may effectively reduce the "dead zone" or non-functional area inside the pixel circuit, thereby minimizing the physical area of each pixel circuit, which is beneficial to improving the pixel density of the display panel. In addition, since the first light-emitting control transistor M6 and the second light-emitting control transistor M1 are both connected to the light emission control signal line Emit, when the first light-emitting control transistor M6 and the second light-emitting control transistor M1 are concentrated on one side of the gate of the driving transistor M3, the length of the connection line between the first light-emitting control transistor M6 and the second light-emitting control transistor M1 and the light emission control signal line Emit may be shortened. The shorter and more direct wiring path reduces the intersection and congestion between different wiring, and reduces the complexity of wiring. At the same time, a shorter wiring length means a smaller parasitic resistance and parasitic capacitance, which reduces the voltage drop on the current path, helps realize the simultaneous opening or closing of the first light-emitting control transistor M6 and the second light-emitting control transistor M1, and is beneficial to improving the circuit response speed.

Referring continuously to FIG. 2 and FIG. 9, in some embodiments, the width-to-length ratio of the second light-emitting control transistor M1 is greater than the width-to-length ratio of the first light-emitting control transistor M6.

The second light-emitting control transistor M1 is connected between the first power supply terminal PVDD and the driving transistor M3, and is usually one of the transistors closest to the power supply in the light-emitting path. As a light-emitting control transistor, the second light-emitting control transistor M1 needs to be fully turned on when emitting light, and efficiently transfers the voltage and current of the first power supply terminal PVDD to the driving transistor M3. Therefore, the second light-emitting control transistor M1 needs to be able to carry and effectively transmit the operating current of the entire pixel. When the width-to-length ratio of the second light-emitting control transistor M1 is set larger, it is beneficial to ensure that it has extremely low on-resistance and sufficient current-carrying capacity, thereby ensuring that the connection path from the first power supply terminal PVDD to the driving transistor M3 may efficiently and losslessly transmit large currents. This prevents the second light-emitting control transistor M1 itself from becoming a current bottleneck, thereby providing a stable and sufficient power supply voltage and current for the driving transistor M3, and minimizing the voltage drop loss at the power supply terminal.

The above embodiments are just described by taking the pixel circuit including 7 transistors and 1 capacitor as an example, but the present disclosure is not limited to this. In some embodiments, the pixel circuit may also include a pulse amplitude modulation circuit and a pulse width modulation circuit, the pulse width modulation circuit is electrically connected to the pulse amplitude modulation circuit, and the pulse amplitude modulation circuit is configured to be electrically connected to the light-emitting element. This type of pixel circuit is configured as a whole to provide a driving current to the light-emitting element, where the pulse amplitude modulation circuit is configured to control the amplitude of the driving current based on the applied pulse amplitude modulation data, and the pulse width modulation circuit is configured to control the pulse width of the driving current. Optionally, the pulse width modulation circuit may also include the light-emitting branch mentioned in the above embodiments, the difference being that the output terminal of the light-emitting branch in the above embodiments is connected to the light-emitting element, while the output terminal of the light-emitting branch of the pulse width modulation circuit in the disclosed embodiment is connected to the pulse amplitude modulation circuit. In the disclosed embodiment, the resistance relationship of the first connection part in the light-emitting branch in the pulse width modulation circuit and the related materials may be designed according to the first connection part of the light-emitting branch in the above embodiments, which is also conducive to improving the current uniformity of light-emitting elements of different colors and effectively alleviating the color cast problem. It should be noted that the specific circuit structures of the pulse amplitude modulation circuit and the pulse width modulation circuit may refer to the relevant technology and will not be described in detail in the embodiments of the present disclosure.

Figure 14:
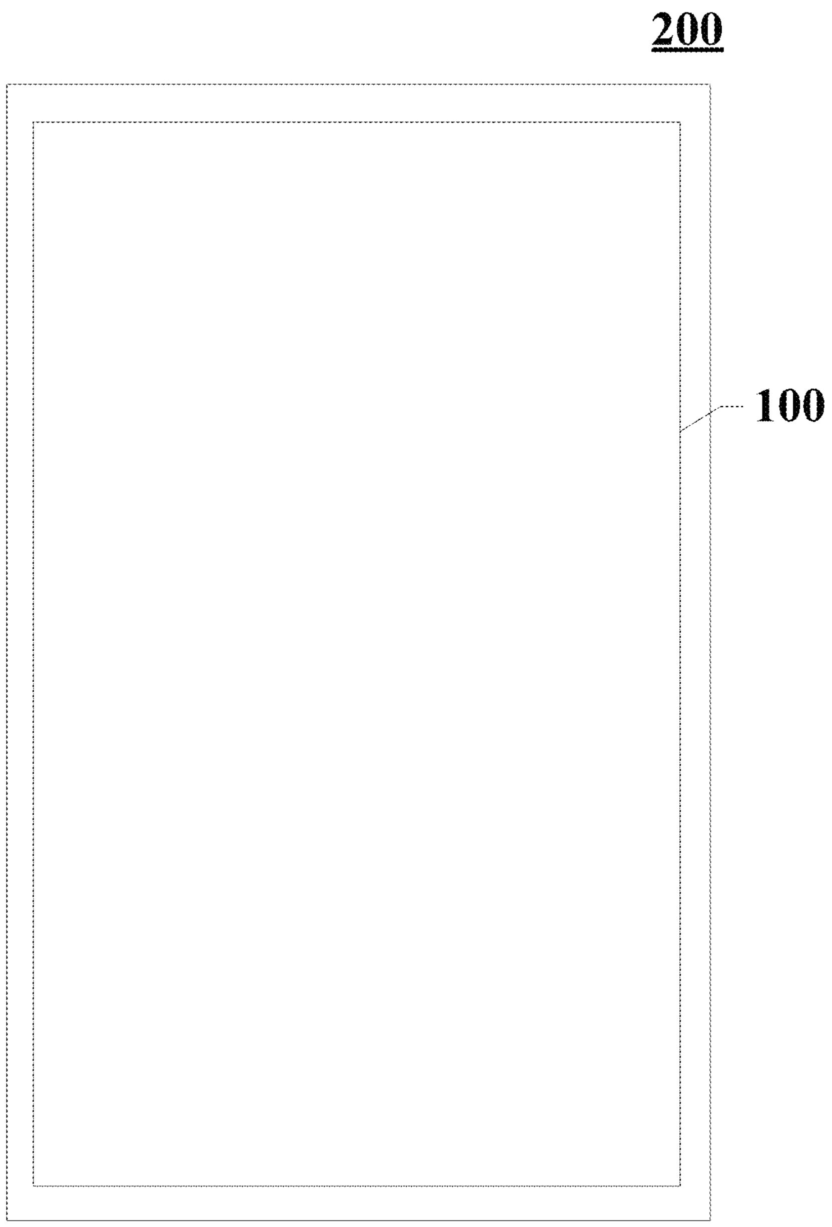
FIG. 14 is a schematic structural diagram of a display device in accordance with an embodiment of the present disclosure.

Based on the same inventive concepts, the present disclosure further provides a display device. FIG. 14 is a schematic structural diagram of a display device 200 in accordance with an embodiment of the present disclosure. Referring to FIG. 14, the display device 200 includes a display panel 100 in any of the above embodiments. The display device 200 provided in the embodiments of the present disclosure may be any electronic device with a display function, such as a touch screen, a mobile phone, a tablet, a laptop, an e-book, a television, etc. The display device 200 provided in the embodiments of the present disclosure has the beneficial effects of the display panel provided in the embodiments of the present disclosure. For details, refer to the specific descriptions of the display panel in the above embodiments, which will not be repeated in the disclosed embodiment.

It may be understood that FIG. 14 just illustrates one shape of the display device 200 by taking a rectangular structure as an example. In some embodiments, the display device 200 may also be circular, elliptical or any other feasible shape, which is not specifically limited in the present disclosure.

Compared with the existing technologies, the technical solution provided by the embodiments of the present disclosure has the following advantages:

In the display panel and display device provided by the embodiments of the present disclosure, the first connection part in the pixel circuit is located on the path from the driving transistor to the first light-emitting control transistor. Therefore, the resistance of the first connection parts corresponding to at least two different pixel circuits is designed differently. When considering the influence of the first connection part, assuming that the resistance of the first connection part is R, this resistance will produce an additional voltage drop V(R). At this moment, the total voltage across the light-emitting branch becomes: PVDD-PVEE=Vds(M1)+Vds(M3)+Vds(M6)+Vd0+V(R), which is converted into the cross-voltage relationship of the driving transistor M3: Vds(M3)=(PVDD-PVEE)−Vds(M1)−Vds(M6)−Vd0−V(R). When the resistance of the first connection part in a certain pixel circuit is large, the corresponding voltage drop V(R) will be large. This additional voltage drop will "share" part of the total power supply voltage drop, thereby reducing the voltage division Vds(M3) of the driving transistor. In this way, even if the voltage division Vds(M3) of the driving transistor is too large due to the low turn-on voltage of the light-emitting element D0, it may be pulled back to a level similar to the voltage division Vds(M3) of the driving transistor corresponding to other light-emitting elements by increasing the resistance of the corresponding first connection part. Similarly, when the resistance of the first connection part in a pixel circuit is small, the corresponding voltage drop V(R) will be small. This allows the driving transistor in the pixel circuit to have more space to form the voltage division Vds(M3), thereby increasing the voltage division Vds(M3) of the driving transistor in the corresponding pixel circuit. In this way, even if the higher turn-on voltage of the light-emitting element corresponding to the pixel circuit has "occupied" a larger part of the voltage drop, by reducing the voltage drop of the corresponding first connection part in the pixel circuit, it may be ensured that the driving transistor may still obtain sufficient voltage division Vds(M3) to operate stably, and at the same time it is beneficial to reduce the voltage division difference with the driving transistor in other pixel circuits. In this way, by differentially designing the resistance of the corresponding first connection parts in the two pixel circuits, the problem of poor current uniformity caused by the voltage division difference of the pixel circuit driving transistors corresponding to different light-emitting elements may be improved. This thus significantly enhances the current uniformity of the pixel circuits corresponding to light-emitting elements of different colors, thereby effectively alleviating the color cast problem and achieving more accurate and realistic color performance.

It should be noted that, in the present disclosure, relational terms such as "first" and "second" are merely used to distinguish one entity or operation from another entity or operation, and do not necessarily require or imply any such actual relationship or order between these entities or operations. Moreover, the terms "include", "comprise" or any other variants thereof are intended to cover non-exclusive inclusion, so that a process, method, article or device including a series of elements includes not only those elements, but also other elements not explicitly listed, or also includes elements inherent to such process, method, article or device. In the absence of further restrictions, the elements defined by the sentence "comprise a . . . " do not exclude the existence of other identical elements in the process, method, article or device including the elements.

The foregoing descriptions are just some specific embodiments of the present disclosure, so that a person skilled in the art may understand or implement the present disclosure. Various modifications to these embodiments will be apparent to a person skilled in the art, and the general principles defined herein may be implemented in other embodiments without departing from the spirit or scope of the present disclosure. Therefore, the present disclosure will not be limited to the embodiments described herein, but will conform to the widest scope consistent with the principles and novel features disclosed herein.

What is claimed is:

1. A display panel, comprising a light-emitting element and a pixel circuit connected to the light-emitting element, wherein:

the pixel circuit includes a driving transistor and a first light-emitting control transistor, wherein a first electrode of the driving transistor is coupled to a first power supply terminal, and a second electrode of the driving transistor is connected to a first electrode of the first light-emitting control transistor through a first connection part, a second electrode of the first light-emitting control transistor is coupled to a first electrode of the light-emitting element, and a second electrode of the light-emitting element is coupled to a second power supply terminal; and resistance of first connection parts corresponding to at least two different pixel circuits is different.

2. The display panel according to claim 1, wherein:

the light-emitting element includes a first light-emitting element and a second light-emitting element, and light-emitting colors of the first light-emitting element and the second light-emitting element are different;

the pixel circuit includes a first pixel circuit and a second pixel circuit, the first pixel circuit is electrically connected to the first light-emitting element, and the second pixel circuit is electrically connected to the second light-emitting element; and a turn-on voltage of the first light-emitting element is lower than a turn-on voltage of the second light-emitting element, and a resistance of a first connection part in the first pixel circuit is higher than a resistance of a first connection part in the second pixel circuit.

3. The display panel according to claim 2, wherein materials of first connection parts corresponding to the first pixel circuit and the second pixel circuit are the same, and a width of the first connection part of the first pixel circuit is smaller than a width of the first connection part of the second pixel circuit, and a width direction of the first connection part is perpendicular to an extension direction of the first connection part.

4. The display panel according to claim 3, further comprising a semiconductor layer, wherein the first connection parts corresponding to the first pixel circuit and the second pixel circuit are both located in the semiconductor layer.

5. The display panel according to claim 2, wherein first connection parts corresponding to the first pixel circuit and the second pixel circuit are made of different materials, and a sheet resistance of the first connection part in the first pixel circuit is greater than a sheet resistance of the first connection part in the second pixel circuit.

6. The display panel according to claim 5, wherein the sheet resistance of the first connection part in the first pixel circuit is R1, the sheet resistance of the first connection part in the second pixel circuit is R2, R1=K*R2, wherein $K \geq 10^5$.

7. The display panel according to claim 6, wherein R2≤1 Ω/sq.

8. The display panel according to claim 5, wherein the first connection part of the first pixel circuit includes a semiconductor material, and the first connection part of the second pixel circuit includes a metal material.

9. The display panel according to claim 8, further comprising a semiconductor layer and at least one metal layer, wherein the first connection part of the first pixel circuit is disposed in the semiconductor layer, and the first connection part of the second pixel circuit is disposed in the at least one the metal layer.

10. The display panel according to claim 2, wherein:

the first connection part includes a first sub-portion and a second sub-portion connected to each other, the first sub-portion extends along a first direction, the second sub-portion extends along a second direction, and the first direction and the second direction intersect;

the first sub-portion is located on one side of a gate of the driving transistor along the second direction, and the second sub-portion is located on one side of the gate of the driving transistor along the first direction;

the first connection part corresponding to the second pixel circuit includes a metal material, and in the first connection part corresponding to the second pixel circuit, the first sub-portion is connected to a semiconductor layer of the driving transistor through a first connection hole, and the second sub-portion is connected to a semiconductor layer of the first light-emitting control transistor through a second connection hole; and the first connection part corresponding to the first pixel circuit includes a semiconductor material, in the first connection part corresponding to the first pixel circuit, the first sub-portion and the second sub-portion are arranged in a same layer as the semiconductor layer of the driving transistor and the first light-emitting control transistor.

11. The display panel according to claim 10, wherein a length of a second sub-portion of the second pixel circuit is greater than a length of a second sub-portion of the first pixel circuit.

12. The display panel according to claim 10, further comprising a first scan line and a second scan line extending along the first direction, the first scan line configured to provide a first scan signal to the pixel circuit, and the second scan line configured to provide a second scan signal to the pixel circuit, wherein:

in an area corresponding to the pixel circuit, along the second direction, the second scanning line is located between the first scanning line and the gate of the driving transistor; and in an area corresponding to the first pixel circuit, along the second direction, a distance between the second scan line and the gate of the driving transistor is d1, and in an area corresponding to the second pixel circuit, along the second direction, a distance between the second scan line and the gate of the driving transistor is d2, wherein d1<d2.

13. The display panel according to claim 12, further comprising an extension portion electrically connected to the second scan line, the extension portion being located between the first scan line and the second scan line, wherein:

the pixel circuit further includes a threshold compensation transistor, a first electrode of the threshold compensation transistor is electrically connected to the first connection part, a second electrode of the threshold compensation transistor is connected to the gate of the driving transistor, and a control terminal of the threshold compensation transistor is electrically connected to the second scan line; and the threshold compensation transistor includes a first sub-transistor and a second sub-transistor connected in series, a gate of the first sub-transistor overlaps with the second scan line, and a gate of the second sub-transistor overlaps with the extension portion.

14. The display panel according to claim 2, wherein:

the light-emitting element further includes a third light-emitting element, and a light-emitting color of the third light-emitting element is different from the light-emitting colors of the first light-emitting element and the second light-emitting element;

the pixel circuit further includes a third pixel circuit, and the third light-emitting element is electrically connected to the third pixel circuit;

the turn-on voltage of the second light-emitting element is less than or equal to a turn-on voltage of the third light-emitting element; and the resistance of the first connection part in the second pixel circuit is greater than or equal to a resistance of a first connection part in the third pixel circuit.

15. The display panel according to claim 14, wherein the first light-emitting element is a red light-emitting element, the second light-emitting element is one of a green light-emitting element and a blue light-emitting element, and the third light-emitting element is another one of the green light-emitting element and the blue light-emitting element.

16. The display panel according to claim 1, wherein:

the light-emitting element includes a first light-emitting element, a second light-emitting element and a third light-emitting element, the first light-emitting element is a red light-emitting element, the second light-emitting element is one of a green light-emitting element and a blue light-emitting element, and the third light-emitting element is another one of the green light-emitting element and the blue light-emitting element;

the pixel circuit includes a first pixel circuit, a second pixel circuit and a third pixel circuit, the first light-emitting element is electrically connected to the first pixel circuit, the second light-emitting element is electrically connected to the second pixel circuit, and the third light-emitting element is electrically connected to the third pixel circuit;

a turn-on voltage of the first light-emitting element is less than a turn-on voltage of the second light-emitting element, and the turn-on voltage of the second light-emitting element is less than or equal to a turn-on voltage of the third light-emitting element; and a first connection part of the first pixel circuit includes a semiconductor material, and first connection parts of the second pixel circuit and the third pixel circuit include a metal material.

17. The display panel according to claim 2, wherein in the first pixel circuit, a channel width-to-length ratio of the driving transistor is A1, and a channel width-to-length ratio of the first light-emitting control transistor is K1, and in the second pixel circuit, a channel width-to-length ratio of the driving transistor is A2, and a channel width-to-length ratio of the first light-emitting control transistor is K2, wherein A1/K1>A2/K2.

18. The display panel according to claim 1, wherein:

the pixel circuit further includes a second light-emitting control transistor, and the second light-emitting control transistor is connected between the first electrode of the driving transistor and the first power supply terminal; and in an area where the pixel circuit is located, the first light-emitting control transistor and the second light-emitting control transistor are located on a same side of a gate of the driving transistor along a second direction.

19. The display panel according to claim 18, wherein a width-to-length ratio of the second light-emitting control transistor is greater than a width-to-length ratio of the first light-emitting control transistor.

20. A display device, comprising a display panel, and the display panel including a light-emitting element and a pixel circuit connected to the light-emitting element, wherein:

the pixel circuit includes a driving transistor and a first light-emitting control transistor, wherein a first electrode of the driving transistor is coupled to a first power supply terminal, and a second electrode of the driving transistor is connected to a first electrode of the first light-emitting control transistor through a first connection part, a second electrode of the first light-emitting control transistor is coupled to a first electrode of the light-emitting element, and a second electrode of the light-emitting element is coupled to a second power supply terminal; and resistance of first connection parts corresponding to at least two different pixel circuits is different.

* * * * *